United States Patent [19]

Berger et al.

[11] Patent Number: 4,819,067
[45] Date of Patent: Apr. 4, 1989

[54] LINE-TRANSFER PHOTOSENSITIVE DEVICE

[75] Inventors: Jean L. Berger, Grenoble; Louis Brissot, St. Egreve; Yvon Cazaux, Grenoble, all of France

[73] Assignee: Thomson-LSF, Paris, France

[21] Appl. No.: 48,476

[22] Filed: May 6, 1987

Related U.S. Application Data

[63] Continuation of Ser. No. 647,718, Sep. 5, 1984, abandoned.

[30] Foreign Application Priority Data

Sep. 13, 1983 [FR] France .................... 86 14543

[51] Int. Cl.$^4$ .......................... H01L 29/78
[52] U.S. Cl. ......................... 357/24; 377/62
[58] Field of Search ............... 357/24 LR, 24 M, 24; 377/62

[56] References Cited

U.S. PATENT DOCUMENTS

| | | | |
|---|---|---|---|
| 4,093,872 | 6/1978 | Hartman et al. | 357/24 LR X |
| 4,229,752 | 10/1980 | Hynecek | 357/24 |
| 4,246,591 | 1/1981 | Kosonocky et al. | 357/241 R X |
| 4,430,672 | 2/1984 | Berger | 357/213 |
| 4,506,299 | 3/1985 | Berger et al. | 358/213 |
| 4,562,363 | 12/1985 | Jones et al. | 357/24 M X |
| 4,611,234 | 9/1985 | Berger et al. | 358/213 |

FOREIGN PATENT DOCUMENTS

| | | | |
|---|---|---|---|
| 0001146 | 3/1979 | European Pat. Off. | 357/24 M |
| 54-121088 | 9/1979 | Japan | 357/24 LR |

OTHER PUBLICATIONS

Kosonocky, W. F., and Carnes, J. E., "Basic Concepts of Charge-Coupled Devices", RCA Review, vol. 36, Sep. 1975, pp. 567–583.

Chamberlain, S. G., "High Speed Scanner Photoelement with Gain", IBM Tech. Disc. Bull. vol. 19, No. 11, Apr. 1977, pp. 4458–4460.

Ohba, S., Aoki, M. Nakai, M., Shimada, S., Uchiumi, K., Fujita, M. and Kubo, M., "A 1024-Element Linear CCD Photo Sensor with Unique Photodiode Structure", IEEE Trans. on Electron Devices, vol. ED-27, No. 9, Sep. 1980, pp. 1804–1808.

Primary Examiner—Andrew J. James
Assistant Examiner—Sara W. Crane
Attorney, Agent, or Firm—Roland Plottel

[57] ABSTRACT

An improved line-transfer photosensitive device and particularly a device which operates with a double drive charge comprises on at least one semiconductor substrate a photosensitive region made up of M lines of N photosensitive points. The photosensitive points of the different lines are connected in parallel by means of conductive columns to a line memory which carries out at least the transfer of the signal charges integrated on any one line of the phtosensitive region to a read register consisting of a charge-coupled shift register of the volume transfer type. The line memory is formed on a semiconductor substrate region having an impurity implantation of opposite type with respect to the substrate in order to produce a volume charge transfer. The region in which the line memory is formed has a dopant concentration which is lower than or equal to that of the region in which the shift register is formed.

4 Claims, 3 Drawing Sheets

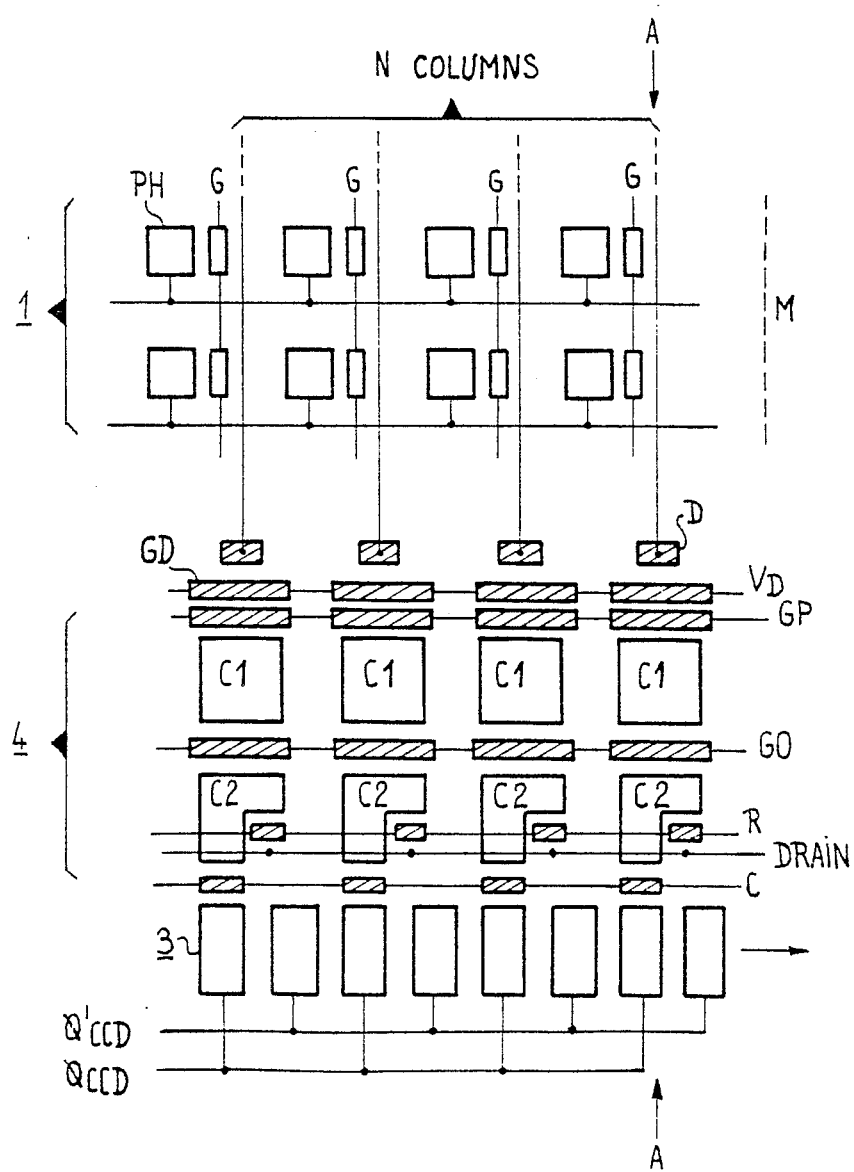

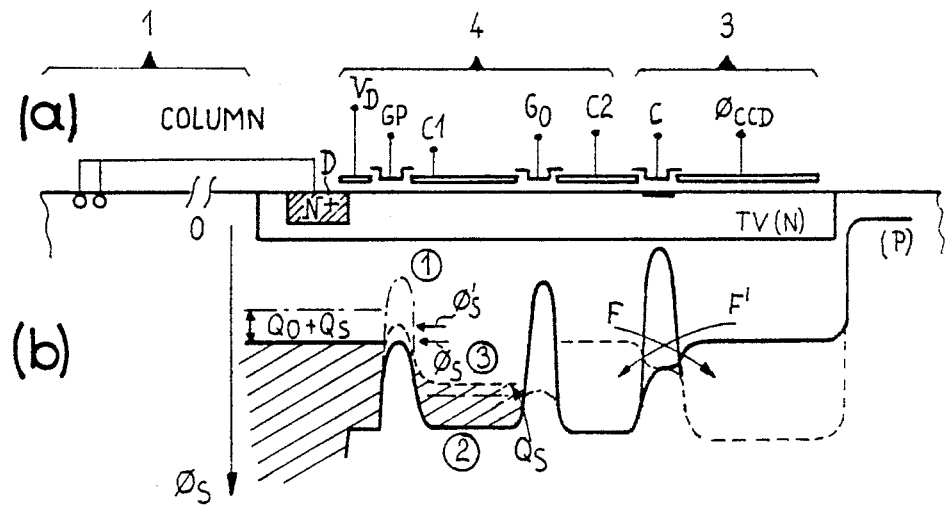
FIG_2
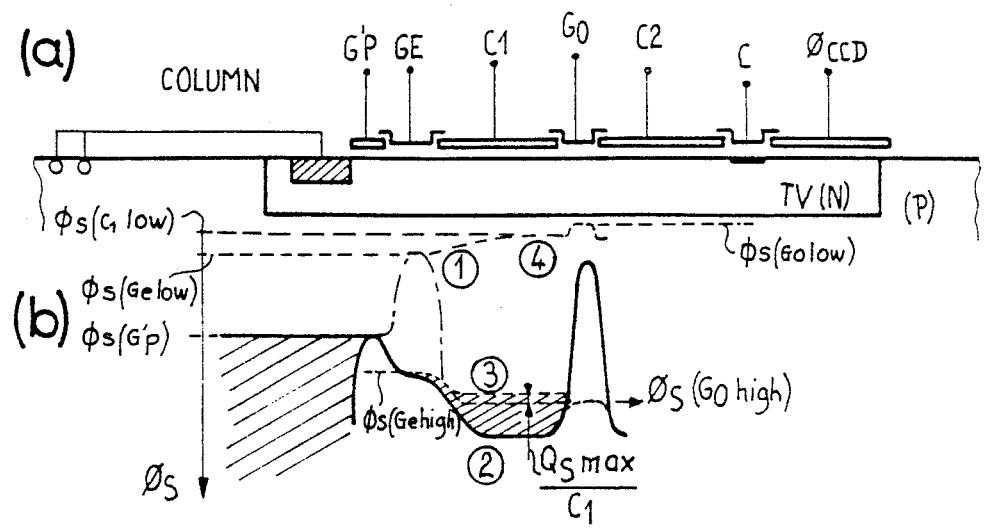
FIG_3

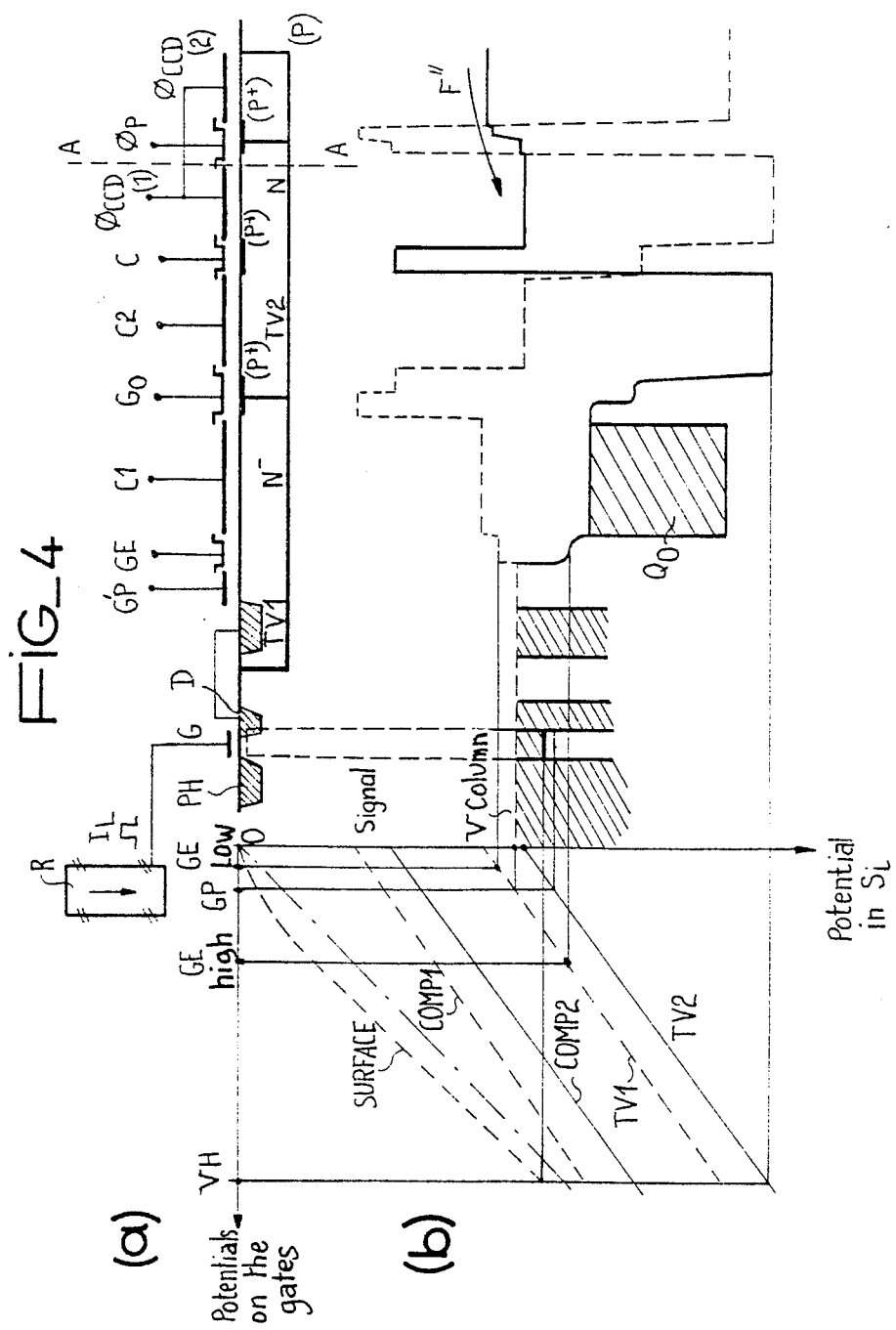

LINE-TRANSFER PHOTOSENSITIVE DEVICE

This application is a continuation of application Ser. No. 647,718, filed Sept. 5, 1984, now abandoned.

BACKGROUND OF THE INVENTION

1. Field of the Invention

This invention relates to photosensitive devices of the so-called "line transfer" type for scanning light images.

2. Description of the Prior Art

As described in U.S. patent application Ser. No. 368,005, now U.S. Pat. No. 4,506,246, and Ser. No. 562,462, now U.S. Pat. No. 4,611,234, assigned to THOMSON-CSF, this type of device mainly comprises:

a photosensitive region consisting of M lines each made up of N photosensitive points, the image to be read being projected onto said region and converted to electric charges designated as signal charges;

an interface element consisting of M points, or so-called line memory, which is connected by means of conductive columns to the photosensitive points of the different lines and is intended to receive successively the signal charges stored by each line;

a shift register of the type known as a charge-coupled device (CCD) for receiving the contents of the line memory in parallel and delivering the image-scan electric signal in series.

Preferably, the photosensitive device described above comprises means for removing parasitic charges and said means can be associated with the line memory as described in the patent applications cited earlier.

In order to increase the speed of transfer of the signal charges as well as the efficiency of transfer, the read register usually consists of a CCD register of the volume or bulk transfer type. Such a CCD register is also known as the buried channel type to differentiate it from the surface channel type.

However, when it is desired, for example, to inject charges from the read register to the line memory as described in U.S. patent application Ser. No. 562,462, now U.S. Pat. No. 4,611,234, it is no longer possible to employ a volume transfer into the read register. In this case, in respect of one and the same voltage applied to the gates, the surface potentials are at a higher level than in the case of a surface transfer and the charges present within the shift register cannot pass into the line memory.

SUMMARY OF THE INVENTION

The aim of the present invention is consequently to make a number of improvements in line-transfer photosensitive devices with a view to permitting the use of a read register consisting of a CCD register of the volume transfer type irrespective of the scanning method adopted.

Thus the present invention is directed to a line-transfer photosensitive device comprising on at least one semiconductor substrate a photosensitive region made up of M lines of N photosensitive points. The photosensitive points of the different lines are connected in parallel by means of conductive columns to an interface element or so-called line memory which ensures at least the transfer of the signal charges integrated on one and the same line of the photosensitive region to a read register consisting of a charge-coupled shift register of the volume transfer type. The distinctive feature of the device in accordance with the invention lies in the fact that the line memory is formed on at least one semiconductor substrate region having an impurity implantation of opposite type with respect ot the substrate in order to produce a "volume charge transfer", the dopant concentration of the region in which the line memory is formed being lower than or equal to that of the region in which the shift register is formed.

In the event that the dopant concentration of the line memory region is equal to that of the shift register region, a two-way communication is obtained between the line memory and the shift register, with all the advantages of a volume transfer.

In fact, while the present invention appears to be more particularly advantageous for the purpose of carrying out a two-way transfer of charges in the case of photosensitive devices which operate with a double drive charge, the invention is also applicable to other line-transfer photosensitive devices inasmuch as the use of a volume transfer for the line memory offers a certain number of advantages in regard to efficiency of vertical transfer, transfer noise, and so on.

Thus in the case of identical applied voltages on the line memory elements, the potential of the columns is much higher. In point of fact, most of the columns consist of interconnected read diodes which are reverse-biased. In consequence, if their bias voltage is higher, they have a lower capacitance. Thus the efficiency of vertical transfer which is inversely proportional to the capacitance of the columns is therefore improved.

Furthermore, the noise of column transfer to line memory has two causes, namely a thermal noise which is proportional to the square root of the column capacitance and a noise which is proportional to the surface and volume traps beneath the transfer gate between the columns and the line memory. The transition to volume transfer reduces these two components by reducing the column capacitance as mentioned above and by removing the surface traps.

However, at the time of volume transfer, the lateral electric field effects are much greater than at the time of a surface transfer. This results in modulation of the potential barrier beneath the transfer gate provided between the conductive columns and the line memory and the effect of this modulation is to limit the transfer efficiency.

In accordance with the present invention and in order to overcome this disadvantage, the transfer gate between the conductive columns and the line memory is constituted by a first gate brought to a direct-current voltage which establishes the column potential and a second gate brought to a periodic potential in order to effect transfer of charges from the column to the line memory.

In another aspect, the invention relates to a method for operating a line transfer photosensitive device of the kind described to take advantage of its novel structure for improved volume transfer which involves the application of appropriate potentials to the first and second gates.

BRIEF DESCRIPTION OF THE DRAWINGS

Other features of the invention will be more apparent upon consideration of the following description and accompanying drawings, wherein FIG. 1 is a schematic plan view of a first embodiment of a line-transfer photosensitive device to which the present invention applies;

FIGS. 2a and 2b are respectively a sectional view taken along line A—A of FIG. 1 and a diagram providing an explanatory illustration of the device;

FIGS. 3a and 3b are respectively a sectional view which is similar to that of FIG. 2a and shows a modified embodiment of the present invention, and a diagram providing an explanatory illustration of the operation of the device;

FIGS. 4a and 4b are respectively a sectional view which is similar to that of FIG. 2a and shows another embodiment of the present invention, and a diagram providing an explanatory illustration of this embodiment.

In the different figures, the same references designate the same elements but the dimensions and proportions of the various elements have not been observed for the sake of enhanced clarity.

DESCRIPTION OF THE PREFERRED EMBODIMENTS

FIGS. 1, 2a and 2b represent different views of a line-transfer photosensitive device to which the present invention applies.

Said line-transfer photosensitive device corresponds to the device which is disclosed in U.S. patent application Ser. No. 562,462, now U.S. Pat. No. 4,611 234 assigned to THOMSON-CSF, and permits scanning of the image by means of a double drive charge.

In these figures, reference numeral 1 designates the photosensitive region, reference numeral 4 designates the line memory and reference numeral 3 designates the read register.

The photosensitive region 1 is constituted by a matrix of M lines each consisting of N photosensitive points PH. This region receives the light image to be scanned and converts it to electric charges or so-called signal charges $Q_S$. The photosensitive points of any one line are connected to each other and to an address register (not shown in the drawings) which makes it possible to select one line of the matrix. The photosensitive points of any one column are joined to a common connection designated hereinafter as a column connection which is in turn connected to a line memory 4. As shown in FIGS. 1 and 2a, the connections derived from the columns of the photosensitive matrix each terminate in a diode D or so-called receiving diode for the signal charges $Q_S$ derived from the matrix. By way of example, said diode is fabricated by doping with impurities of opposite type which respect to the semiconductor substrate on which the photosensitive matrix 1 is formed.

In the embodiment illustrated, the line memory 4 comprises a series of intermediate capacitors $C_1$ in which are stored the drive charges $Q_O$ as explained in U.S. patent application Ser. No. 368,005, now U.S. Pat. No. 4,506,296 and Ser. No. 562,462, now U.S. Pat. No. 4,611,234, assigned to THOMSON-CSF. A transfer gate $G_P$ controls the transfer between each column and the corresponding intermediate capacitor. The potential of said gate has the function of establishing the potential of the column connections.

The transfer gate $G_P$ is preceded by a screen gate $G_D$ which has the function of forming a screen for the charges between the diodes D and the remainder of the device shown in FIGS. 1 and 2a, thus making it possible to prevent transmission of parasitic charges to the column connections. It is in fact particularly important in charge-coupled devices to guard against parasitic charges, the amplitude of which may vary from one point of the circuit to the next according to the geometrical variations of the elements and which limit the dynamic range of the signal. To this end, the gate $G_D$ is connected to a constant potential $V_D$.

The intermediate capacitors $C_1$ are followed by switching means which direct the contents of the capacitors either to an evacuation drain or to a read register 3.

As illustrated in FIG. 1, the intermediate capacitors $C_1$ are followed by gates $G_O$ for retaining the drive charges $Q_O$ within the intermediate capacitors and for establishing their amplitudes. The gates $G_O$ are followed by capacitors $C_2$ which serve as a central switching unit and serve to direct the charges from the capacitors $C_1$ either to the evacuation drain after passing through a gate R or to the read register 3 after passing through a gate C. The access to each capacitor 2 is therefore controlled by three gates: one gate $G_O$ which permits arrival of the charges and two gates R and C which permit departure of the charges either to the drain or to the read register.

The read register 3 consist of a charge-coupled register of the type known as a CCD (charge-coupled device). As shown in FIG. 2a, the charge-coupled register 3 is a register of the volume transfer type. There is also shown in FIG. 1 a charge-coupled register having two control phases $\phi_{CCD}$ and $\phi'_{CCD}$. However, it is apparent to any one versed in the art that the present invention is applicable to CCD registers of the volume transfer type having any number of control phases.

In consequence, since the read register 3 is of the volume transfer type, the present invention offers the attractive possibility of fabricating the different elements constituting the line memory by adopting the principle of volume transfer. In consequence, the line memory 4 is fabricated on a semiconductor substrate region which has an implantation of impurities of opposite type with respect to that of the substrate, that is, an N-type impurity implantation in the case of a P-type substrate as shown in FIG. 2a in which said substrate region is designated by the reference TV(N). The dopant concentration of the line memory region 4 can be lower than or equal to that of the shift register region 3 in order to permit at least the transfer of charges from the line memory 4 to the CCD register 3. In the embodiment shown in FIG. 2a, equal dopant concentrations are chosen for both regions. In this case, as indicated by the arrows F and F' in FIG. 2b, it is possible to transfer charges with equal ease both from the line memory to the CCD register and from the CCD register to the line memory. This is particularly advantageous in the case of operation with a double drive charge as described in patent application Ser. No. 562,462, now U.S. Pat. No. 4,611,234.

When the dopant concentration of the memory region is lower than that of the CCD register, a two-way transfer of charges between the memory and the read register is no longer possible. However, a line-transfer photosensitive device comprising a line memory providing volume transfer offers a certain number of specific advantages such as an improvement in efficiency of vertical transfer from columns to line memory and a reduction in transfer noises as described in the introductory part of this application.

However, as illustrated in FIG. 2b, this efficiency of vertical transfer is limited by a known phenomenon arising from the interaction between the transfer gate $G_P$ and the intermediate capacitor $C_1$. At the level of the junction between these two elements, there is produced a lateral electric field which is stronger as the volume transfer is of greater depth.

As shown in FIG. 2b, prior to transfer of the charge ($Q_S + Q_O$ in the case of operation with a double drive charge) from the column to the intermediate capacitor $C_1$, the potential beneath the transfer gate $G_P$ is at the low level, namely in accordance with the chain-dotted line bearing the reference ①. In order to carry out transfer of the charge, the potential barrier beneath the gate $G_P$ undergoes a transition to the high level, namely in the full-line position designated by the reference ②. The charge ($Q_S + Q_O$) is then transferred beneath the capacitor $C_1$ which is at the high level and the potential beneath the capacitor $C_1$ undergoes a progressive variation so as to correspond to the configuration designated by the reference ③. The progressive variation in potential from ② to ③ beneath the capacitor $C_1$ induces beneath the transfer gate $G_P$ a progressive variation in potential $\phi_S$ to $\phi'_S$ shown as a dashed line. This induced variation $\Delta\phi = \phi_S - \phi'_S$ is greater as the volume transfer is of greater depth since the lateral fields are of greater intensity in this case. As clearly shown in FIG. 2b, the variation $\Delta\phi$ modulates the column current in the direction of the capacitor $C_1$ both in a high inversion regime and in a low inversion regime, thus having the effect of retaining part of the charges on the column and consequently resulting in inefficiency of vertical transfer.

In accordance with the present invention and as illustrated in FIGS. 3a and 3b, it is proposed to solve this problem by making use of a transfer gate constituted by a first transfer gate $G'_P$ located immediately after the diode D and brought to a d.c. bias voltage which sets the column potential at a precise value and by a second gate $G_E$ which is located between the first transfer gate $G'_P$ and the capacitor $C_1$ and has the function of initiating or interrupting the transfer according as said gate is biased at a high level or at a low level.

With this particular structure, the surface potential beneath the gates $G'_P$ and $G_E$ and the intermediate storage capacitor $C_1$ has the configuration designated by the reference ① in FIG. 3b. At the time of transfer of charges, the gate $G_E$ is brought to a high level such that its surface potential $\phi_S(G_{Ehigh})$ is between the surface potentials $\phi_S(G'_P)$ and $\phi_S(C_{1high})$. Preferably, in the case of a line-transfer photosensitive device of the type which operates with a double drive charge as shown in FIG. 3a, the surface potential $\phi_S(G_{Ehigh})$ corresponds to the following equation:

$$\phi_S(G'_p) < \phi_S(G_{Ehigh}) < \phi_S(G_{Ohigh}) + \frac{Q_{Smax}}{C_1}$$

with the result that no charge can be stored beneath the gate $G_E$. Under these conditions, the gate $G_E$ isolates the potential beneath the transfer gate $G'_P$ from the variations in potential beneath the capacitor $C_1$ which are a function of the signal charge. This consequently has the effect of considerably improving the transfer efficiency.

Furthermore, especially in the case of operation with a double drive charge as performed with the photosensitive device of FIG. 3a, the low level applied to the gate $G_E$ must be such that:

$$\phi_S(G_{Elow}) \cong \phi_S(C_{1low}) > \phi_S(G_{Olow})$$

in order to ensure that the charge $Q_O$ can be wholly restituted on the column. Furthermore, in order to satisfy this condition and also in order to prevent the charge $Q_O$ from partly flowing toward the capacitor $C_2$ when the capacitor $C_1$ is at the low level, it is useful to effect an insulating implantation beneath the gate $G_O$ provided between the capacitor $C_1$ and the capacitor $C_2$. The potential profile designated by the reference 4 in FIG. 3b is then obtained.

In FIGS. 4a and 4b, there is shown another embodiment of the present invention. In accordance with this form of construction, the elements of the line memory are formed on two volume transfer regions having different impurity concentrations:
a low-concentration region $TV_1$ (N−) which extends beneath the transfer gate $G_E$, the capacitor $C_1$ and one-half of the intermediate gate $G_O$;
a higher-concentration region $TV_2$ (N) which extends from the center of the intermediate gate $G_O$ to the charge-transfer read register or to the center of the transfer gate $\phi_P$ in the event that the line-transfer photosensitive device comprises two charge-transfer shift registers $\phi_{CCD\ 1}$ and $\phi_{CCD\ 2}$ for injecting the second drive charge as described in the U.S. patent application Ser. No. 562,462, now U.S. Pat. No. 4,611,234.

In a preferential embodiment, the higher-concentration region $TV_2$ (N) is formed by enrichment of the region $TV_1$ which initially extends beneath the entire line memory as well as over the CCD register or registers, depending on the type of photosensitive device employed.

Furthermore, a single diffusion of (P+) impurities establishes the potentials in the transfer regions of the CCD read register beneath the gate C and beneath the gate $G_O$. The surface potentials beneath the different gates are given by the characteristics COMP 1, $TV_1$ or COMP 2, $TV_2$ as shown on the left-hand side of FIG. 4b, depending on whether the region considered is either $TV_1$ or $TV_2$. The left-hand portion of FIG. 4b is a graph which shows a number of different curves in terms of the substrate dopant concentration and in which the surface potential is plotted as a function of the potential applied to the gates.

The configuration of FIG. 4a is of particular interest when the photosensitive element is a photodiode. In order to avoid an effect of remanence, it is in fact essential to ensure that the pulse IL delivered by the vertical shift register R and applied to the read gate G is of sufficiently high value to ensure that, at the moment of reading, the MOS transistor constituted by the photodiode PH, the read gate G and the diode D is biased as a triode. In this case, the column imposes its potential on the photodiode as shown in FIG. 4b and there are no remanences other than the inefficiency of vertical transfer.

In fact, if the amplitude of the pulse IL is not sufficient, the above-mentioned MOS transistor is biased in the saturating mode and the transfer of the signal charges to the column ends with a slight inversion, thereby producing a remanence effect which is greater as the level of light intensity is lower.

Now in the case of a line memory designed to provide volume transfer, the potential applied to the column is high, which is an advantage from the point of view of column capacitance but a disadvantage in regard to control of reading of the photodiodes. In this case, the high level of the pulse IL must in fact be higher than the column potential plus the threshold value of the read gate in order to ensure that the MOS transistor constituted by the photodiode PH, the read gate G and the diode D is in the triode regime. Furthermore, in order to achieve good isolation with a broad dynamic range of storage between the photodiodes PH and the corresponding conductive columns, the threshold of the read gate G must be positive or, in other words, the transfer beneath this gate must take place at the surface. These conditions considered together entail the need for a very high level of the pulse IL when the impurity or dopant concentration of the line memory region is of high value as is necessarily the case in order to obtain good transfer efficiency in the read register 3.

The structure shown in FIG. 4a in which the line memory region 4 is formed on two regions $TV_1$ and $TV_2$ having different concentrations makes it possible to limit the amplitude of the pulse IL without modifying the transfer efficiency of the CCD register.

In this case, as clearly shown in FIG. 4b, the pulse IL can have the same amplitude $V_H$ as the control phases $\phi_{CCD}$ applied to the read register. When the pulse IL is at the high level, the triode regime is in fact established since $$V_{column} = \phi_{TV1}(G_P) < \phi_{surface}(V_H)$$

whereas this relation cannot be obtained with $$V_{column} = \phi_{TV2}(G_P).$$

Furthermore, in the case of a photosensitive device which operates with a double drive charge, it is advantageous to ensure that the low level of $G_E$ is equal to $G_P/2$ in order to satisfy the relation $$|V_{col}| > |\phi_{TV1}(G_{Elow})| > |\phi_{TV1}(O)|.$$

Thus the drive charge can be transferred from the capacitors $C_1$ to the conductive columns as shown in FIG. 4b.

Moreover, the region $TV_2$ having a high impurity concentration begins at the center of the gate $G_O$ which separates the intermediate capacitors $C_1$ from the capacitors $C_2$. This results in a screen effect which improves the transfer from the capacitors $C_1$ to the capacitors $C_2$. In fact:

the portion $TV_2$ of the gate $G_O$ fixes the potential beneath the capacitor $C_1$ by retaining the charge $Q_O$; and the portion $TV_2$ of the gate $G_O$ isolates the portion $TV_1$ from the influence of the variations in potential beneath the capacitor $C_2$ as a function of the signal transferred, as explained earlier with reference to FIGS. 3a and 3b.

Moreover, in the event that use is made of two CCD registers $\phi_{CCD1}$ and $\phi_{CCD2}$, namely one register for reading and the other register for injecting charges, as mentioned earlier, the second register $\phi_{CCD2}$ is fabricated preferably in the region $TV_1$ as shown in FIG. 4a. The charge transfer represented schematically by the reference F″ accordingly takes place from region $TV_1$ to region $TV_2$ when the phase of the registers $\phi_{CCD1}$ and $\phi_{CCD2}$ is at the low level, the gate $\phi_P$ being biased at an intermediate level.

In the foregoing description, reference has been made to line-transfer photosensitive devices of the type described in U.S. patent application Ser. No. 368,005, now U.S. Pat. No. 4,506,296, and Ser. No. 562,462, now U.S. Pat. No. 4,611,234. However, it is apparent to any one versed in the art that the present invention is equally applicable to other types of photosensitive devices comprising an interface element between the photosensitive region and a charge-transfer shift register.

What is claimed is:

1. A line-transfer photosensitive device comprising on a semi-conductor substrate a photosensitive region (1) comprising M lines of N photosensitive points, the photosensitive points (PH) of the different lines being connected in parallel by means of conductive columns to an interface single line memory which carries out at least the transfer of the signal charges integrated on one and the same line of the photosensitive region to a read register consisting of a volume transfer charge-coupled shift register formed on a semiconductor substrate region having an impurity zone of opposite type with respect to the substrate in order to obtain a charge transfer of the volume-transfer type, wherein the line memory is formed on a semiconductor substrate region having an impurity zone of opposite conductivity type with respect to the substrate in order to produce a volume charge transfer, the dopant concentration of the region wherein the line memory is formed being no greater than that of the region wherein the shift register is formed, and wherein the line memory comprises a plurality of storage capacitors, each capacitor being connected to a respective one of said columns through a diode and transfer gate means, said transfer gate means comprising adjacent to the diode a first gate maintained at a d-c voltage relative to the substrate for establishing a steady potential on the column and for establishing beneath said first gate a threshold for a quantity of charges to be transferred, and a second gate between the first gate and the capacitor maintained at a potential relative to the substrate which varies periodically between a prescribed high level and a prescribed low level for initiating and stopping, respectively, the transfer of charges from the column to the capacitor, the potential at the high level being sufficient to inhibit charge storage beneath the second gate, characterized in that the device further includes a second plurality of storage capacitors, each of which is coupled respectively to a storage capacitor of the plurality forming the line memory by way of an intermediate gate wherein the prescribed high level of the potential which varies periodically corresponds to the relation $$\phi_s(G'_p) < \phi_s(G_{Ehigh}) < \phi_s(G_{Ohigh}) + (Q_{Smax}/C_1)$$

with $\phi_s(G'_p)$: the surface potential beneath the first gate, $\phi_s(G_{Ohigh})$: the high level of the surface potential of the intermediate gate $C_1$: the value of the storage capacitors of the line memory $Q_{Smax}$: the maximum quantity of signal charge, wherein the prescribed low level of the potential which varies periodically satisfies the further relation $$\phi_s(G_{Elow}) > \phi_s(C_{1low}) > \phi_s(G_{Olow})$$

with $\phi_s(C_{1low})$: the low level of the surface potential beneath the storage capacitors of the line memory $\phi_s(G_{Olow})$: the low level of the surface potential beneath the intermediate gate.

2. A line-transfer device in accordance with claim 1 wherein beneath the intermediate gate there is formed a zone of the conductivity type of the substrate and opposite that of the line memory.

3. A line-transfer device in accordance with claim 2 in which the regions of the semiconductor substrate which are located beneath the first and second gates, the plurality of storage capacitors comprising the line memory and one half of the intermediate gate have a lower impurity concentration than the regions which are located beneath the other half of the intermediate gate and the second plurality of storage capacitors.

4. The method of operating a line-transfer photosensitive device comprising on a semiconductor substrate a photosensitive region (1) comprising M lines of N photosensitive points, the photosensitive points (PH) of the different lines being connected in a parallel by means of conductive columns to an interface single line memory which carries out at least the transfer of the signal charges integrated on one and the same line of the photosensitive region to a read register consisting of a volume transfer charge-coupled shift register formed on a semiconductor substrate region having an impurity zone of opposite type with respect to the substrate in order to obtain a charge transfer of the volume transfer type, wherein the line memory is formed on a semiconductor substrate region having an impurity zone of opposite conductivity type with respect to the substrate in order to produce a volume charge transfer, the dopant concentration of the region wherein the line memory is formed being no greater than that of the region wherein the shift register is formed, and wherein the line memory comprises a plurality of storage capacitors, each capacitor being connected to a respective one of said columns through a diode and transfer gate means, said transfer gate means comprising a first gate adjacent to the diode and a second gate between the first gate and the capacitor said method comprising maintaining the first gate at a d-c potential relative to the substrate for establishing a steady potential on the column, and establishing on the second gate a potential relative to the substrate which varies periodically between a prescribed high level and a prescribed low level for initiating and stopping, respectively, the transfer of charges from the column to the capacitor, the potential at the high level being sufficient to inhibit charge storage beneath the second gate, characterized in that the device further includes a second plurality of storage capacitors each of which is coupled respectively to a storage capacitor of the plurality forming the line memory by way of an intermediate gate wherein the prescribed high level of the potential which varies periodically corresponds to the relation $$\phi_s(G'_p) < \phi_s(G_{Ehigh}) < \phi_s(G_{Ohigh}) + (Q_{Smax}/C_1)$$

with $\phi_s(G'_p)$: the surface potential beneath the first gate, $\phi_s(G_{Ohigh})$: the high level of the surface potential of the intermediate gate $C_1$: the value of the storage capacitors of the line memory $Q_{Smax}$: the maximum quantity of signal charge, wherein the prescribed low level of the potential which varies periodically satisfies the further relation $$\phi_s(G_{Elow}) > \phi_s(C_{1low}) > \phi_s(G_{Olow})$$

with $\phi_s(C_{1low})$: the low level of the surface potential beneath the storage capacitors of the line memory $\phi_s(G_{Olow})$: the low level of the surface potential beneath the intermediate gate.

* * * * *